(12) United States Patent
Inukai (10) Patent No.: US 7,169,708 B2
(45) Date of Patent: Jan. 30, 2007

(54) SEMICONDUCTOR DEVICE FABRICATION METHOD

(75) Inventor: Kazuaki Inukai, Hamamatsu (JP)

(73) Assignee: Rohm Co., Ltd., Kyoto (JP)

( * ) Notice: Subject to any disclaimer, the term of this patent is extended or adjusted under 35 U.S.C. 154(b) by 46 days.

(21) Appl. No.: 11/037,110

(22) Filed: Jan. 19, 2005

(65) Prior Publication Data

US 2005/0287811 A1  Dec. 29, 2005

(30) Foreign Application Priority Data

Jun. 28, 2004  (JP) .............................. 2004-189380

(51) Int. Cl.
*H01L 21/311* (2006.01)
(52) U.S. Cl. ...................... 438/700; 438/618
(58) Field of Classification Search ................ 438/618, 438/634, 700, 796, 931
See application file for complete search history.

(56) References Cited

U.S. PATENT DOCUMENTS 6,191,031 B1 *  2/2001  Taguchi et al. ............. 438/642

(Continued)

FOREIGN PATENT DOCUMENTS

| EP | 1276147 A | 1/2003 |
| EP | 1385201 A | 1/2004 |
| FR | 2855324 | 11/2004 |
| JP | 2001-203194 | 7/2001 |
| JP | 2004-87744 | 3/2004 |
| WO | WO 01/29879 A2 | 4/2001 |
| WO | WO 01/59825 A1 | 8/2001 |

OTHER PUBLICATIONS

Furukawa et al., "Etch and strip induced material modification of porous low-K (K=2.2) dielectric," Microelectronic Engineering 76(1-4):25-31, Oct. 2004.
Ohashi et al., "Robust Porous MSQ (k=2.3, E=12 GPa) for Low-temperature (<350°C.) Cu/Low-k Integration using ArF Resist Mask Process," Int'l Electron Devices Meeting 2003. IEDM. Technical Digest, Washington, DC, Dec. 8-10, 2003, New York, NY: IEEE, US, Dec. 8, 2003, pp. 857-860, XP010684210.
Blaschta et al, "SiO$_2$ aerogel ultra low k dielectric patterning using different hard mask concepts and stripping processes," Microelectronic Engineering 76(1-4):8-15, Oct. 2004.

Primary Examiner—Phuc T. Dang
(74) Attorney, Agent, or Firm—Fish & Richardson P.C.

(57) ABSTRACT

A method of performing microfabrication using a hard mask in the manufacture of a semiconductor device having an interlayer dielectric (ILD) film made of low-dielectric constant, K, insulating material is provided. When treating a low-K dielectric film for use in semiconductor integrated circuitry and its underlying etching stopper film, a patterned resist film is used as a mask to etch a hard mask film. Subsequently, the resist pattern is subjected to stripping or "ashing" in the atmosphere of a mixture gas of hydrogen (H$_2$) and helium (He) at a temperature higher than 200° C. under a pressure of about 1 Torr. With this procedure, microfabrication relying upon the hard mask less in facet is achievable during its subsequent etching of the low-K dielectric film, without damaging the hard mask film upon removal of the resist.

13 Claims, 3 Drawing Sheets

U.S. PATENT DOCUMENTS

| | | | |
|---|---|---|---|
| 6,506,692 B2 * | 1/2003 | Andideh | 438/796 |
| 6,737,350 B1 * | 5/2004 | Akahori et al. | 438/634 |
| 6,806,203 B2 * | 10/2004 | Weidman et al. | 438/736 |
| 7,015,133 B2 * | 3/2006 | Su et al. | 438/618 |
| 2003/0032300 A1 | 2/2003 | Waldfried et al. | |
| 2004/0084412 A1 | 5/2004 | Waldfried et al. | |
| 2004/0235239 A1 | 11/2004 | Inukai et al. | |
| 2005/0110153 A1 * | 5/2005 | Wu et al. | 257/762 |

* cited by examiner

SEMICONDUCTOR DEVICE FABRICATION METHOD

TECHNICAL FIELD

The present invention relates generally to a method of making a semiconductor device using a low-dielectric constant (K) insulative film, and more particularly to a semiconductor device fabricating method with reduced damageability of a hard mask film or the like during the stripping or "ashing" of a resist layer.

BACKGROUND OF THE INVENTION

Metallic interconnect wiring conductors in semiconductor integrated circuit (IC) chips are such that as wiring pattern layout pitches shrink, metals increase in electrical resistance and interlayer dielectric (ILD) films increase in capacitance. These pose a serious problem as to on-chip signal transmission delays. In order to avoid this problem, it becomes inevitable to employ high conductivity material, such as copper (Cu), for wires while using a certain insulative material with low dielectric constants for dielectric films. The latter is known as low-dielectric constant insulative film, also called "low-K" insulator film. A typical approach to forming the metal wires is to utilize a damascene method having the steps of defining grooves or holes in a low-K insulator film, burying Cu therein by plating techniques, and then performing planarization. A well-known representative one of the low-K insulator film is a porous low-K dielectric film as formed by introduction of vacant holes or voids thereinto.

Prior known low-K insulator film processing methodology includes a method for performing film treatment by using a patterned resist layer as a mask, and a method of doing the same by use of a hard mask. In the case of the resist mask using method, a resist pattern with less edge rounding risks is obtainable. However, this advantage does not come without accompanying a penalty: the low-K insulator film can be damaged during a subsequent stripping or "ashing" process.

On the contrary, the hard mask-used patterning method is expected to be a promising approach in view of the fact that it requires no such ashing process and thus the film damageability is avoidable. Usually in this case, the etching of a hard mask is performed with a resist pattern as a mask, followed by execution of the etching of its underlying low-K insulator film after removal of the resist. During the ashing of this resist after having etched the hard mask, an oxygen ($O_2$) gas is typically used (see JP-A-2002-203852). In the prior art ashing process using the $O_2$ gas at high temperatures, the hard mask film would often be thermally damaged, resulting in the hard mask becoming a $SiO_2$-like film. In the next step of etching the low-K insulator film, the selection ratio required for the hard mask can decrease undesirably.

Another known approach is to use an ammonia ($NH_3$) gas or a mixture gas of nitrogen ($N_2$) and hydrogen ($H_2$) to perform the ashing at temperatures lower than or equal to 25° C. under a pressure of 0.1 Torr or below (see JP-A-2002-043422). However, this approach with such the ashing conditions is faced with a problem which follows: a previously processed or "pretreated" hard mask can experience unwanted edge rounding—this is sometimes called "shoulder sloping"—by the influence of residual ions in a plasma, by way of example. The hard mask's rounded edge shape becomes more noticeable in the next low-K insulator film processing step.

SUMMARY OF THE INVENTION

As previously stated, the ashing of a resist after the processing of a hard mask by prior art methods is deemed inappropriate for use in high-precision micro-fabrication because of the fact that the once-etched hard mask becomes rounded at edges of its cross-section and thus has an unintentional taper-like shape.

The present invention was made to solve the foregoing problems faced with the prior art, and its object is to provide a method of making a semiconductor device capable of performing highly accurate patterning treatment in a resist pattern ashing process while offering enhanced size controllability without damaging a hard mask film.

This invention was made by taking account of the capability for reducing damages to be given to a hard mask by using a mixture gas of hydrogen ($H_2$) and helium (He) as an ashing gas during plasma-assisted ashing of a resist pattern which is used when patterning the hard mask.

In accordance with one aspect of the invention, a semiconductor device fabrication method is provided, which includes the steps of forming on or above a substrate an insulative film with a low dielectric constant (K), forming a hard mask film on the low-K insulator film, forming on a surface of the hard mask film a resist pattern through deposition and development of a resist film, etching the hard mask film with the resist pattern as a mask to thereby form a patterned hard mask, removing the resist pattern by a stripping or "ashing" treatment, and etching the low-K insulator film by use of the hard mask to thereby form a pattern required. During the ashing of the resist pattern, a mixture gas of hydrogen ($H_2$) and helium (He) is used to remove the resist by ashing.

In accordance with another aspect of the invention, a semiconductor device fabrication method includes the steps of forming an etching stopper film on a substrate, forming on a surface of the etch stop film a low-K dielectric insulator film, forming a hard mask film on a surface of the low-K insulator film, forming a resist pattern on a surface of the hard mask film a resist layer through deposition and development of a resist layer, selectively etching the hard mask film with the resist pattern as a mask to thereby form a patterned hard mask, removing the resist pattern by applying ashing thereto, etching the low-K film by using the hard mask to thereby pattern this film, and etching the etch stop film to thereby form a desired pattern. In the resist pattern ashing process, a mixture gas of $H_2$ and He is used for execution of the ashing removal of the resist.

DETAILED DESCRIPTION OF THE INVENTION

First Embodiment

Currently preferred embodiments of the present invention will now be explained with reference to the accompanying drawings below. FIGS. 1A to 1F are diagrams showing, in cross-section, some major process steps of a semiconductor device fabrication method embodying the invention.

Principally, the method shown in FIGS. 1A–1F is the one having the steps of forming above a substrate a low-dielectric constant insulative film (i.e., insulator film forming step), forming on its surface a hard mask film (hard mask forming step), forming on its surface a resist film to thereby form a resist pattern by exposure and development processing (resist pattern forming step), patterning the hard mask film to form a hard mask (hard mask forming step), performing stripping or "ashing" to remove the resist pattern (ashing step), and using the hard mask to pattern the low-K dielectric film (low-K insulator film processing step). Below is an explanation of each of these steps with reference to FIGS. 1A–1F.

Insulator Film Forming Step

Figure 1A:
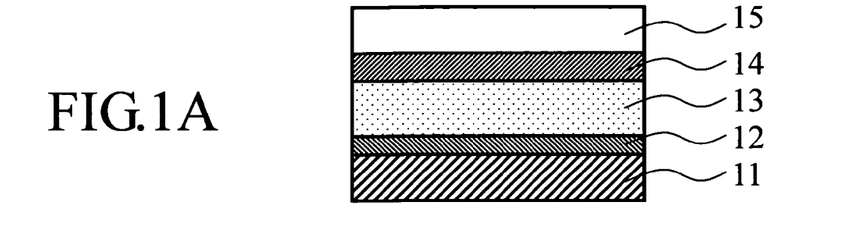
FIGS. 1A through 1F are diagrams depicting, in cross-section, some major process steps in the manufacture of a semiconductor device in accordance with a first embodiment of this invention.

As shown in FIG. 1A, this step is for formation of a low-dielectric constant ("low-K") insulating film 13 above a top surface of a substrate 11.

This substrate 11 may be either a silicon wafer itself or a silicon wafer with semiconductor devices formed on its surface. Alternatively, the substrate 11 may be the one with electrical interconnect wires or interlayer dielectric (ILD) films or various types of functional elements are formed thereon along with their associated metallic and dielectric films or various kinds of functional films. Another example of the substrate is the one having a copper wiring film buried in a low-K insulator film overlying a silicon wafer. Still another example is the one with a layer of silicon coupling agent being formed on or above the substrate surface in order to improve the adhesivity thereof. A further example is the one having an etching stopper film formed thereon. In FIG. 1A, there is shown an example that an etch stop film 12 is formed on the top surface of the substrate 11.

This etch stop film 12 may be made of a currently available material. Examples of the material are ceramics films of SiC, $Si_3N_4$, SiCN, SiCO or equivalents thereto.

The low-dielectric constant insulator film 13 in this step is made of low-K dielectric materials that contain therein Si, C, O and H. Alternatively, the film may be a low-K dielectric film using an organic hydrocarbon polymeric low-K insulator material. Preferably, its dielectric constant (K) is three (3) or less.

Examples of the low-K insulator material that contains Si, C, O and H include but not limited to polyorganosiloxane, such as methylsilsesquioxane (MSQ) and methylated hydrogen silsesquioxane (MHSQ), and SiOC.

Examples of the organic hydrocarbon polymer-based low-K dielectric material may include polyallylether (PAE), divinylsiloxane-bis-benzocyclobutene (BCB) and polyimide.

The low-K insulator film 13 may be formed by currently established chemical vapor deposition (CVD) methods or coating methods. This low-K insulator film has a thickness ranging from approximately 0.1 to 0.05 micrometers (μm), although the invention should not specifically be limited thereto. Note that this low-K insulator film may be replaced with a porous layer having therein vacant holes or voids. To form such porous layer, coating methods are suitable. Letting the low-K insulator film be a porous layer makes it possible to readily lower the dielectric constant.

Hard Mask Forming Step

Next, a hard mask film 14 is formed on the low-K insulator film 13 as shown in FIG. 1A. This hard mask film 14 may typically be made of SiC, SiOC, SiN, SiCN or other similar suitable materials. Choosing these materials as the hard mask film material is advantageous in that any required selection ratio is establishable in the processing of the low-K insulator film 13. These films are formable by CVD methods or else. The hard mask film 14 is deposited to a thickness of about 20 to 100 nanometers (nm), although not specifically limited thereto.

Resist Pattern Forming Step

Figure 1B:
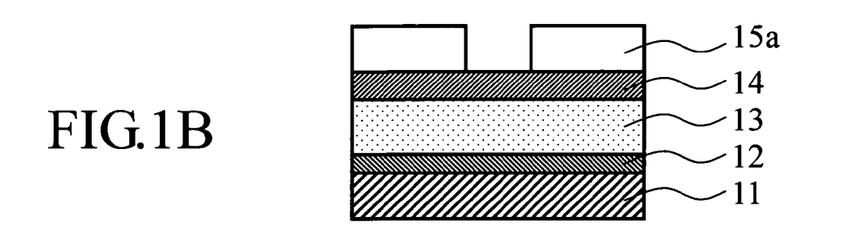

This step is for forming a resist pattern 15a on a top surface of the hard mask film 14 as shown in FIG. 1B. This process starts with coating a resist layer or film 15 on the surface of the hard mask film 14. Then, standard photolithography techniques, which include exposure and development using ultraviolet rays or electron beams, are applied to perform patterning of the resist layer 15 to thereby form a resist pattern 15a. The resist film as used herein is preferably made of excimer laser-use resist material of the chemical amplification type for application to the intended microfabrication in this invention, although not specifically limited thereto.

Hard Mask Forming Step

Figure 1C:
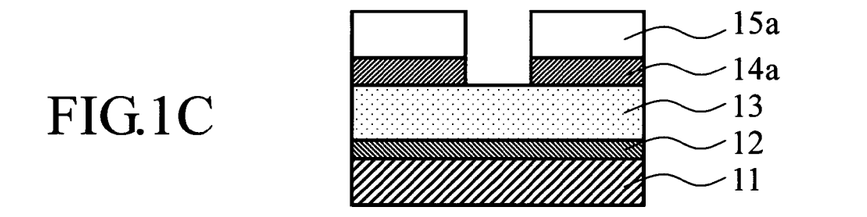

As shown in FIG. 1C, this step is for selectively dry-etching the hard mask film 14 by using the resist pattern 15a thus formed in the preceding step as a mask to thereby form a patterned hard mask structure 14a. Dry etching equipment used in this step may be a radio frequency (RF) parallel flat-plate type reactive ion etcher, such as two-frequency excitable parallel-flatplate reactive ion etcher or else. Using this type of equipment is preferable in a viewpoint of its enhanced size controllability for enabling dry etch treatment with high accuracy and precision.

A gas used during the etching is typically any one of $CF_4$, $CF_4$—$O_2$, $CF_4/H_2$, $NF_3$, $CH_2F_2$, $CHF_3$ gases, although it differs depending on the actually employed material of the hard mask film 14.

Ashing Step

Figure 1D:
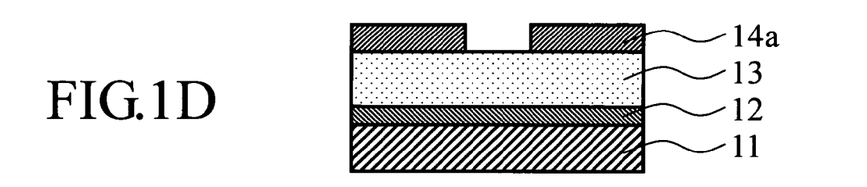

As shown in FIG. 1D, this step is to remove the resist pattern 15a that was used to pattern the hard mask film 14. An important feature of the invention lies in the use of a specifically chosen ashing gas, which is a mixture of hydrogen ($H_2$) and helium (He) gases. Using the mixture gas makes it possible to greatly suppress or minimize any possible damages of the hard mask 14a made of SiC or else during ashing. Another advantage is an ability to form the hard mask free from edge-rounding risks. This can be said because the $H_2$/He mixture gas exhibits a noticeably large selection ratio relative to SiC films during isotropic ashing processes. This in turn enables fabrication of a precise pattern with sharp and "crisp" groove edges.

Preferably the hydrogen is contained in the $H_2$/He mixture gas used in this step is designed to fall within a range of from 1 to 20 percent (%). The setting of this composition ratio is recommendable for the reason which follows. If the ratio of a hydrogen gas is too small, then it causes problems as to rate drop and defects in uniformity. On the contrary, if the hydrogen gas ratio is too large then it can pose unfavorable safely problems concerning explosion limits.

Also note that in this step, the ashing is done at a temperature ranging from 200 to 400° C. This aching temperature setup is preferable for the following reason. If the ashing temperature is 200° C. or below, the ashing speed stays slow, resulting in the lack of an ability to perform the ashing within a practically acceptable length of time period. On the other hand, if the ashing temperature exceeds the above-noted value range, then conflicting or "trade-off" phenomena, such as an increase in stress due to high temperatures, can take place in cases where electrical wiring conductors are made of Cu.

Regarding a pressure during the ashing, this ashing pressure may preferably be set to range from 50 to $1 \times 10^5$ Pascals (Pa). This can be said because the following reason: if the ashing pressure is below the above-noted range, then the density of residual radicals decreases, resulting in a disadvantageous decrease in ashing rate; if the pressure goes beyond the range then radicals no longer diffuse sufficiently, causing the-lack-of-uniformity problem.

Ashing equipment suitably employed in this step may be a so-called remote plasma apparatus, including a plasma generating device and a process chamber, also known as ashing chamber. The plasma generator is provided external to the ashing chamber and is coupled thereto via more than one gas supply pipe. The plasma generator is operable to create a reactive gas containing therein radicals, which gas is then delivered with the aid of a carrier gas for radiating the radicals onto the surface of a target substrate being presently situated within the chamber. Using this type of equipment is deemed preferable in view of the fact that the damageability of the hard mask becomes suppressible.

Low-K Insulator Film Patterning Step

Figure 1E:
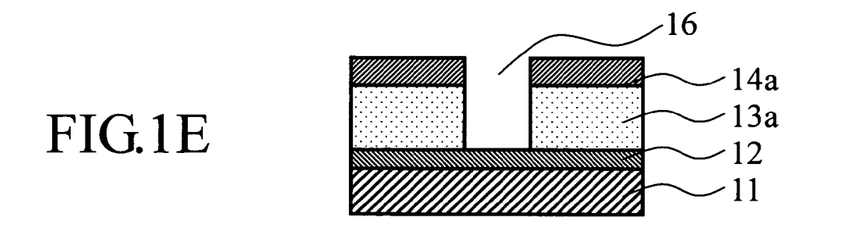

The next step is to define trench-like grooves or holes 16 in the resultant low-K insulator film 13 as shown in FIG. 1E. This is done through selective etching of the low-K insulator film 13 with the use of the hard mask 14*a*. Etching equipment used in this step is a plasma etching apparatus similar to the etcher as has been used to form the hard mask 14*a*. A plasma etching gas employable herein is a CF-based gas, examples of which are $C_4F_8/N_2/Ar$, $C_5F_8/N_2/Ar$ and $C_4F_5/N_2/Ar$ gases.

It should be noted that as the etching stopper film 12 is formed between the substrate 11 and the low-K insulator film 13 in the example of FIGS. 1A–1F, a need is felt in this case to perform additional patterning of such etch stop film 12 after having processed the low-K insulator film 13. A preferable approach to doing this is to use the etcher apparatus used in the previous step(s) to perform plasma etching for execution of the patterning required. An etching gas used here may be any one of $CF_4/N_2/Ar$, $CHF_3/N_2/Ar$ and $CH_2F_2/N_2/Ar$ gases or variants thereof.

Figure 1F:
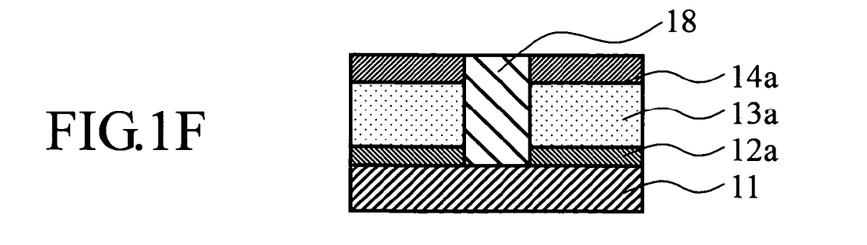

Thereafter, as shown in FIG. 1F, known standard semiconductor fabrication techniques are used to bury a chosen metal such as copper in the grooves or holes 16, thereby forming electrical interconnect wires or via plugs 18, although only one of them is depicted in FIG. 1F for brevity purposes.

Second Embodiment

An explanation will next be given of a second embodiment of the invention with reference to FIGS. 2A to 2H. This embodiment is applied to a method of forming a second layer of electrical interconnect wires by a dual damascene process using a hard mask, and defining via holes therein. FIGS. 2A–2H illustrate, in cross-section, some major steps of such the process. Note that in this embodiment, detailed explanations as to the steps similar to those of the first embodiment stated supra will be eliminated.

Figure 2A:
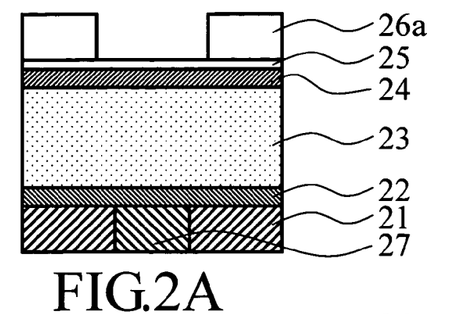
FIG. 2A to 2H illustrate, in cross-section, some major steps in the manufacture of a semiconductor device in accordance with a second embodiment of the invention.

Firstly as shown in FIG. 2A, prepare a substrate 21 in which more than one copper wiring line 27 is buried. On a top surface of substrate 21, form a multilayer structure including an etching stopper film 22, a low-dielectric constant (low-K) insulator film 23, a hard mask film 24 and a reflection preventing film 25. Then, use known techniques to form a patterned resist layer 26*a* on a top surface of the multilayer structure.

Figure 2B:
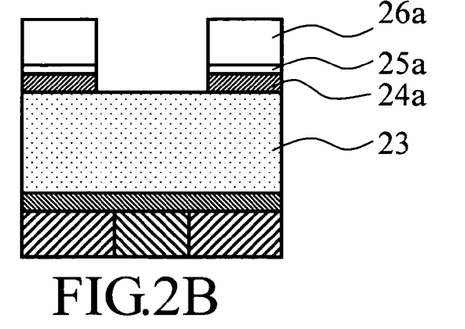

Then, with the use of the resist pattern 26*a,* pattern the anti-reflector film 25 and hard mask film 24 as shown in FIG. 2B to thereby form a patterned antireflector film 25*a* and patterned hard mask film 24*a*.

Figure 2C:
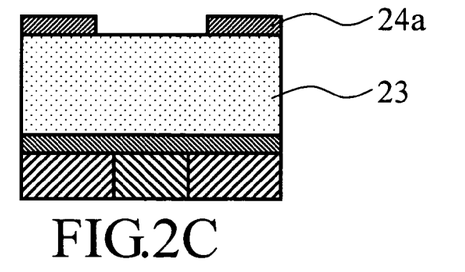

Next, as shown in FIG. 2C, remove the resist pattern 26*a* and patterned antireflector film 25*a* which reside on the surface of the hard mask 24*a* by plasma etching techniques using a mixture gas of $H_2$ and He. In this step, it is possible to reduce damages of the hard mask, by performing etching using the $H_2/He$ mixture gas similar to that in the first embodiment stated supra.

Figure 2D:
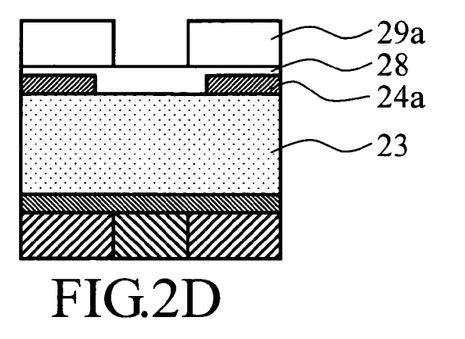
Figure 2E:
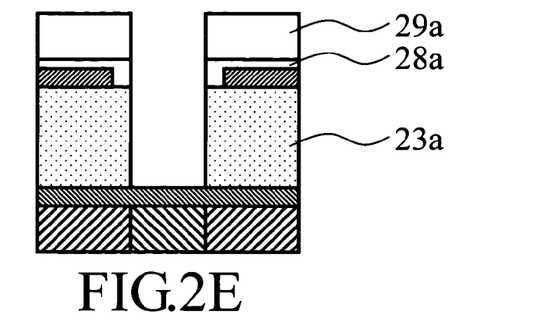

Next, as shown in FIG. 2D, photolithographically form on the hard mask 24*a* a resist film 28 and a resist pattern 29*a*. Then, as shown in FIG. 2E, use this resist pattern 29*a* as a mask to selectively etch away the resist film 28 and low-K insulator film 23, thereby defining narrow and deep, trench-like grooves.

Figure 2F:
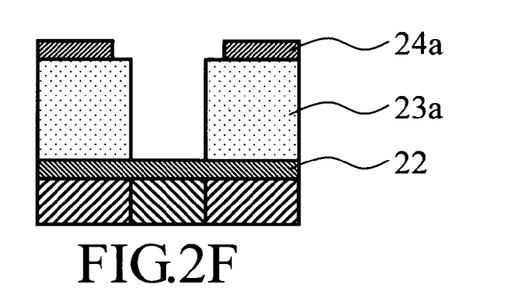

Subsequently, remove by ashing the resist film 28 and resist pattern 29*a*. In this step, a mixture gas of $H_2$ and He is used as a plasma etching gas. Whereby, it is possible to suppress or minimize damages being given to the hard mask for the reason described previously.

Figure 2G:
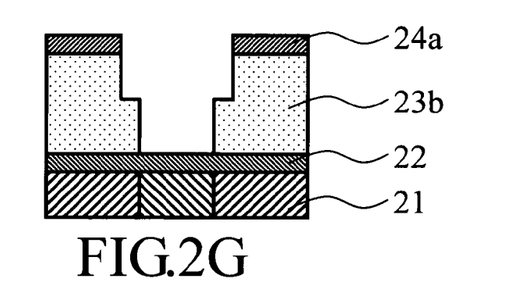

Next as shown in FIG. 2G, apply etching to the low-K insulator film 23*a* with the resulting pattern of hard mask 24*a* as a mask. In this step the etching is specifically controlled to stop in a mid course thereof, thus forming a second layer of interconnect wiring pattern 23*b*.

Figure 2H:
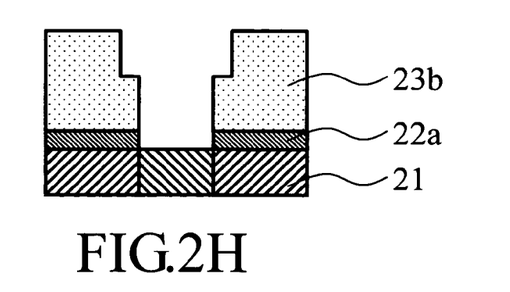

Then, remove by dry etching the hard mask 24*a* as shown in FIG. 2H. With the process steps above, it is possible to define the second-layer grooves by the dual damascene method under precise size control.

Thereafter, copper wires and/or via plugs are formable by known techniques, although not specifically shown in FIGS. 2A–2H.

EXAMPLE 1

An exemplary process for performing a first layer of electrical interconnect wires will be discussed with reference again to FIGS. 1A–1F below.

As shown in FIG. 1A, a Si substrate 11 is prepared. Then, form on Si substrate 11 a SiC film 12 for use as the etch stop film. Next, form thereon a coating-based low-dielectric constant (K) insulator film 13. Thereafter, form an oxide film 14 for use as the hard mask stated supra, followed by formation of a resist film 15.

Then as shown in FIG. 1B, photolithographically pattern the resist 15 to thereby form a resist pattern 15*a*.

Next as shown in FIG. 1C, with the resist pattern 15a as a mask, selectively remove portions of the hard mask 14 by dry etch techniques. An example of the dry etching equipment adaptable for use with this process may be a two-frequency excitable parallel flat-plate reactive ion etcher capable of applying two different high-frequencies of 60 and 2 megahertz (MHz) to upper and lower portions. Here, $C_4F_8$ and $N_2$ plus Ar gases were used at their flow rates of 15, 225 and 1400 sccm, respectively. A mixture of these $C_4F_8/N_2/Ar$ gases is introduced while letting the pressure be kept at 75 mTorr. Apply electrical power of about 2400 watts (W) to the upper part while at the same time applying power of 3300 W to the lower part, resulting in creation of a plasma, thereby to perform etching by use of a CF-based etchant. At this time, a stage temperature is controlled to stay at 40° C.

Then as shown in FIG. 1D, the resist pattern 15a was removed away. Ashing equipment used at this time is an ashing apparatus including a process chamber and a plasma generator device, which device is provided independently of the chamber. This plasma generator is rendered operative to create a plasma, a gas of which contains radicals. This radical-containing gas is transported with the aid of a carrier gas by a remote plasma device as built in the apparatus. Flowing the $H_2$/He mixture gas (hydrogen was contained at 5%) permits the interior of the chamber to stay at a target temperature higher than room temperature—for example, 200 to 400° C. Then, let hydrogen radicals fall onto a wafer under the pressure condition of about 1 Torr, thereby removing the resist. Performing the ashing by hydrogen radicals makes it possible to prevent quality degradation of the SiC film for use as the hard mask. This in turn enabled successful fabrication of the hard mask without suffering from edge rounding risks, because of the fact that isotropic ashing is achievable and it has an extremely large selection ratio relative to SiC films.

Next as shown in FIG. 1E, etching was applied to the low-K insulator film 13 by use of similar etching equipment to that used for the etching of hard mask 14. Chosen gases of $C_4F_8$ and $N_2$ plus Ar were introduced at respective flow rates of 15, 225 and 1400 sccm. While retaining the chamber at an internal pressure of 75 mTorr, apply electric power of 2400 W to the upper part and also apply power of 3300 W to the lower part, resulting in creation of a plasma. A CF-based etchant was used to perform the etching required. At this time the stage temperature was set at 40° C.

Finally, remove selected portions of the SiC film 12 for use as the etch stop layer. At this time the etching was done by using a plasma as created under process conditions which follow: a flow rate of $CF_4$ gas was set at 50 sccm; a flow rate of $N_2$ gas was 300 sccm; a pressure of 150 mTorr; a power applied to the upper part was 1000 W; and, a power to the lower part was 200 W. The stage temperature was kept unchanged to stay at 40° C.

For comparison of the ultimate efficacy of Example 1, a semiconductor device structure was prepared in a similar way to that of Example 1, except for the use of a different gas with oxidizability during resist pattern ashing, such as $O_2$, $NH_3$, $N_2/H_2$ or equivalents thereto. Its process is shown in FIGS. 3A to 3E. A detailed explanation of each step is omitted herein since this process is similar to that shown in FIGS. 1A–1F except that the ashing gas used is different in composition.

Figure 3A:
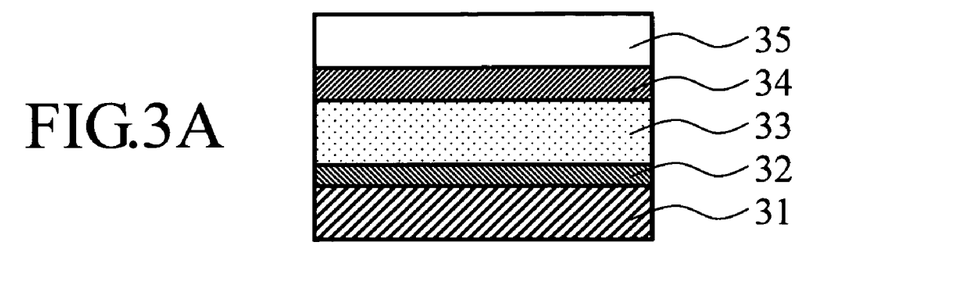
FIGS. 3A–3E are diagrams showing in cross-section some major steps in a prior known process.
Figure 3B:
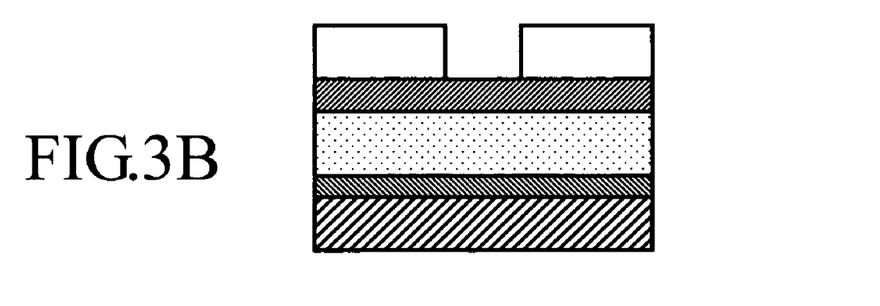
Figure 3C:
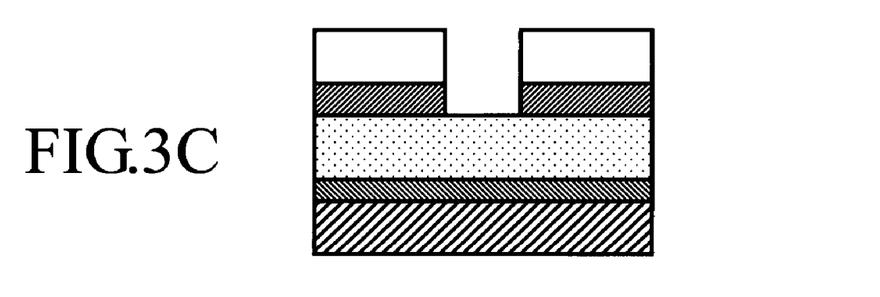
Figure 3D:
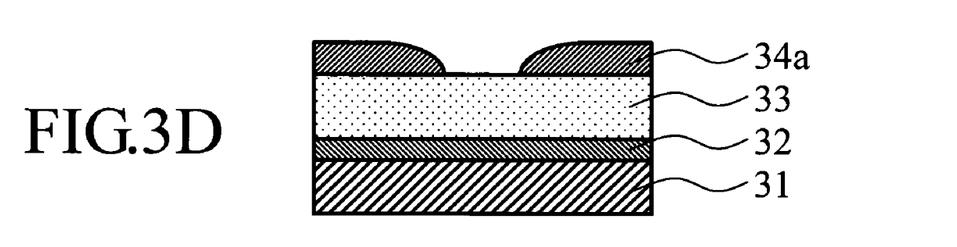
Figure 3E:
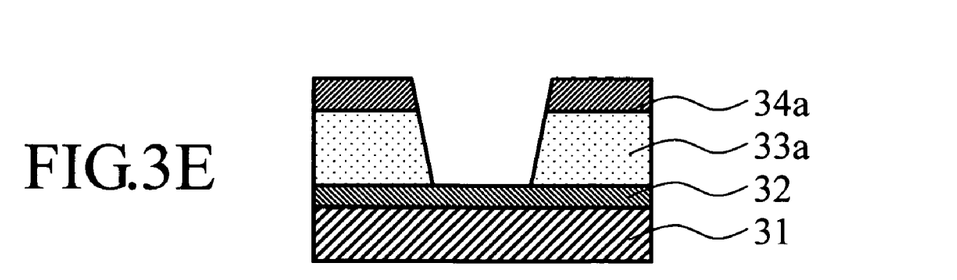

When performing resist removal by traditional ashing techniques using an $O_2$, $NH_3$ or $N_2/H_2$ gas after the formation of a hard mask, the ashing can often result in occurrence of edge rounding of the hard mask due to its own damages as shown in FIG. 3D. If such edge-rounded one is used as a mask for the etching of its underlying low-K dielectric film, then the resultant layer structure must have a taper-like shape under the influence of the mask's edge rounding as shown in FIG. 3E. It is considered that this makes it difficult to achieve any intended microfabrication or "microengineering" with high fidelity to the resist pattern.

In contrast, with the method incorporating the principles of the invention, it became possible, in the manufacture of a low-K insulator film using the hard mask, to realize successful hard-mask fabrication with enhanced size controllability. This advantage was actually obtained by execution of the resist removal under the conditions of a constant temperature and a pressure as established by the use of the $H_2$/He mixture gas after having etched the hard mask.

EXAMPLE 2

A process of forming a second layer of interconnect wires and vias by dual damascene methodology using a hard mask will be explained with reference to FIGS. 2A–2H.

As shown in FIG. 2A, there was prepared a substrate 21 with a first layer of Cu wires 27 being buried therein. Then, form on the substrate surface a SiC film 22 for use as an etching stopper layer. Next, form thereon a coating-based low-K dielectric film 23. After having formed a SiC film 24 for later use as a hard mask, form an anti-reflection film 25, followed by formation of a resist film 26. Thereafter, form a second-layer resist pattern 26a by photolithography of the resist film 26.

Then as shown in FIG. 2B, use the resist pattern 26a as a mask to remove selected portions of the hard mask film 24 by dry etching techniques. An example of the dry etching equipment used in this step may be a two-frequency excitable parallel flat-plate reactive ion etcher capable of applying two different high-frequencies of 60 and 2 MHz to upper and lower portions. A $CF_4$ gas was used, which was introduced at a flow rate of 140 sccm while letting the pressure be kept at 150 mTorr. Under the conditions, apply electrical power of 1500 W to the upper part while applying power of 800 W to the lower part, resulting in creation of a plasma. This plasma was used to perform etching with a CF-based etchant. At this time a stage temperature is controlled to stay at 40° C.

Next as shown in FIG. 2C, the resist pattern 26a was removed away. Ashing equipment at this time was designed to have a remote plasma generator, which is operable to generate a plasma in a way independent of the ashing chamber and then permit delivery of a gas containing the plasma's radicals together with a chosen carrier gas. Flowing the $H_2$/He mixture gas (hydrogen content was 5%) permits the chamber to stay at a predetermined inside temperature higher than room temperature (200 to 400° C.). Then, radiate hydrogen radicals onto a wafer under the condition of a pressure of about 1 Torr, thereby stripping the resist.

Next as shown in FIG. 2D, deposit a photoresist layer 28 to cover or coat the hard mask 24a thus formed in the previous step. Then, form by photolithography a resist pattern 29a for a second layer of vias.

Next, etching equipment similar to that used for etching the hard mask 24 was again used to etch the low-K insulator film 23 with the resist pattern 29a as a mask therefor. In this step, $C_4F_8$ and $N_2$ plus Ar gases were used, which were introduced at flow rates of 15, 225 and 1400 sccm, respectively. While setting the pressure at 75 mTorr, apply electric power of 2400 W to the upper part and also apply power of 3300 W to the lower part, resulting in creation of a plasma.

Using this plasma, the etching was carried out. At this time the stage temperature was kept at 40° C.

Next as shown in FIG. 2E, the resists 28 and 29a were stripped away. Ashing equipment as used herein is a remote plasma apparatus, including a plasma generator device and an ashing chamber. The plasma generator is operable to create a plasma independently of the chamber. Let its radical-containing gas be supplied along with a carrier gas. While letting the chamber stay at a target temperature higher than room temperature (200 to 400° C.) using a $H_2$/He mixture gas, irradiate hydrogen radicals onto a wafer under the condition of a pressure of about 1 Torr, thereby achieving removal of the resists.

Next as shown in FIG. 2F, the same etching apparatus was again used to perform hard-mask etching. Stop this etching when it reaches a vertically mid portion of the low-K insulator film 23, thus forming a second-layer wiring pattern. At this time $C_4F_8$/$N_2$/Ar gases were introduced together at respective flow rates of 10, 150 and 1400 sccm. While setting the pressure at 75 mTorr, apply electric power of 2400 W to the upper part and also apply 3300 W power to the lower part, resulting in creation of a plasma. Using this plasma, the etching was done. The stage temperature was kept at 40° C.

Lastly as shown in FIG. 2G, remove selected portions of the SiC film 22 for use as the etch stop layer. At this time, etching was done by a plasma as created under process conditions which follow: a $CF_4$ gas was introduced at a flow rate of 50 sccm; an $N_2$ gas was fed at a flow rate of 300 sccm; a pressure of 150 mTorr; electrical power applied to the upper part was 1 kW; and electric power to the lower part was 200 W. The stage temperature was kept unchanged to stay at 40° C.

In this low-K dielectric etching step, the low-K insulator film 23 was etched with the groove pattern-predefined SiC film as a hard mask. Consequently, it becomes important to appropriately set up a selection ratio of the SiC film for use as the mask versus the low-K film 23 to be etched. It has been revealed that the SiC film can degrade in quality depending upon ashing conditions after the formation of the hard mask, causing the selection ratio to decrease accordingly. This results in the groove pattern shape becoming much like a taper, which makes difficult the achievement of high-precision microfabrication with increased fidelity to the mask. Fortunately, with the method embodying the invention, it was possible to suppress or minimize such quality degradation of the SiC film to thereby enable achievement of the required microfabrication with excellent step coverage, by specifically arranging the ashing process in a way which follows: the ashing equipment is designed to have a remote plasma generator that creates a plasma separately from the chamber and delivers its radical-containing gas with the aid of a carrier gas, for irradiation of hydrogen radicals onto a target wafer under the condition of a pressure of 50 to $1 \times 10^5$ Pa while using a $H_2$/He mixture gas to retain the atmosphere at a temperature higher than room temperature (200 to 400° C.).

With such the method, it was possible to realize the intended hard mask fabrication processing with enhanced size controllability, by performing removal of resist films at a fixed temperature under a constant pressure after having etched a hard mask even in the formation of a low-K dielectric film for second-layer interconnect wires by the dual damascene technique using the hard mask.

What is claimed is:

1. A method of making a semiconductor device comprising:
    forming on or above a substrate an insulative film with a low dielectric constant, wherein said low dielectric constant insulative film is any one of a low dielectric constant insulator film containing Si, C, O and H or an organic hydrocarbon polymer-based low dielectric constant insulator film, each said insulator film having a dielectric constant of less than or equal to three;
    forming a hard mask film on the low dielectric constant insulative film;
    forming on a surface of said hard mask film a resist pattern through deposition and development of a resist film;
    etching said hard mask film with said resist pattern as a mask to thereby form a hard mask;
    removing said resist pattern by an ashing treatment; and
    etching said low dielectric constant insulative film by use of said hard mask to thereby form a pattern, wherein
    during the ashing of said resist pattern, the resist is stripped away by using a mixture gas of hydrogen (H2) and helium (He).

2. The method according to claim 1, wherein said hard mask film is made of a material as selected from the group consisting of SiC, SiOC, SiN and SiCN.

3. The method according to claim 1, wherein said low dielectric constant insulative film is made of at least one material as selected from the group consisting of MSQ, MHSQ, SiOC, PAE, BCB and polyimide.

4. The method according to claim 1, wherein said low dielectric constant insulative film is formed by any one of chemical vapor deposition (CVD) and coating techniques.

5. The method according to claim 1, wherein said low dielectric constant insulative film is a layer of porous material.

6. A method of making a semiconductor device comprising:
    forming on or above a substrate an insulative film with a low dielectric constant;
    forming a hard mask film on the low dielectric constant insulative film;
    forming on a surface of said hard mask film a resist pattern through deposition and development of a resist film;
    etching said hard mask film with said resist pattern as a mask to thereby form a hard mask;
    removing said resist pattern by an ashing treatment; and
    etching said low dielectric constant insulative film by use of said hard mask to thereby form a pattern, wherein
    during the ashing of said resist pattern, the resist is stripped away by using a mixture gas of hydrogen (H2) and helium (He),
    wherein any one of said hard mask film and said low dielectric constant insulative film is etched by using a reactive ion etcher with radio frequency (RF) biased parallel flat plates.

7. The method according to claim 1, wherein during the ashing of said resist pattern, an ashing temperature is set to range from 200 to 400° C.

8. The method according to claim 1, wherein during the ashing of said resist pattern, ashing is done by use of a remote plasma processing device.

9. The method according to claim 1, wherein during the ashing of said resist pattern, a pressure is 50 to $1 \times 10^5$ Pa.

10. The method according to claim 1, wherein said substrate is a substrate having a wiring layer made of copper.

11. The method according to claim 1 further comprising:
forming an etch stop film between said substrate and said low dielectric constant insulative film.

12. The method according to claim 10, wherein said etch stop film is made of a material as selected from the group consisting of SiC, $Si_3N_4$, SiCN and SiCO.

13. The method according to claim 1, wherein the mixture gas of H2 and He as used during the ashing of said resist pattern has a hydrogen concentration ranging from 1 to 20 volume percent.

* * * * *